United States Patent
Tremolada et al.

(10) Patent No.: US 12,179,736 B2
(45) Date of Patent: Dec. 31, 2024

(54) VEHICLE FOR AGRICULTURAL USE COMPRISING A DETECTION SYSTEM

(71) Applicant: SAME DEUTZ-FAHR ITALIA S.P.A., Treviglio (IT)

(72) Inventors: Simone Tremolada, Treviglio (IT); Matteo Caruso, Treviglio (IT)

(73) Assignee: Same Deutz-Fahr Italia S.P.A., Treviglio (IT)

( * ) Notice: Subject to any disclaimer, the term of this patent is extended or adjusted under 35 U.S.C. 154(b) by 0 days.

(21) Appl. No.: 18/546,942

(22) PCT Filed: Mar. 9, 2022

(86) PCT No.: PCT/IB2022/052079
§ 371 (c)(1),
(2) Date: Aug. 17, 2023

(87) PCT Pub. No.: WO2022/208196
PCT Pub. Date: Oct. 6, 2022

(65) Prior Publication Data
US 2024/0132044 A1 Apr. 25, 2024
US 2024/0227769 A9 Jul. 11, 2024

(30) Foreign Application Priority Data

Apr. 1, 2021 (IT) .......................... 102021000008249

(51) Int. Cl.
*B60W 10/30* (2006.01)
*B60K 25/02* (2006.01)
(Continued)

(52) U.S. Cl.
CPC ............ *B60W 10/30* (2013.01); *B60K 25/02* (2013.01); *B60W 10/04* (2013.01); *B60W 10/06* (2013.01);
(Continued)

(58) Field of Classification Search
None
See application file for complete search history.

(56) References Cited

U.S. PATENT DOCUMENTS

| 7,252,623 B2 * | 8/2007 | Meyer | B60W 10/06 |
| | | | 477/107 |
| 8,374,766 B2 * | 2/2013 | Chisholm | B60W 30/188 |
| | | | 701/99 |

(Continued)

FOREIGN PATENT DOCUMENTS

| CN | 113056592 A | * 6/2021 | ............ E02F 9/2004 |
| CN | 113236763 A | * 8/2021 | ............. B60K 25/06 |

(Continued)

OTHER PUBLICATIONS

International Search Report for International Patent Application No. PCT/IB2022/052079, mailed Jun. 29, 2022.

*Primary Examiner* — Kevin R Steckbauer
(74) *Attorney, Agent, or Firm* — Armstrong Teasdale LLP

(57) ABSTRACT

A vehicle for agricultural use has wheel groups, an engine group, an engine control unit, auxiliary operating groups, a gearbox group, a power take-off group, and a detection system having an engine power detector for detecting an engine power value, an auxiliary power detector for detecting an auxiliary power value, a drive power detector for detecting a drive power value, and an operating unit operatively connected to the detectors to receive the engine power value, auxiliary power value, and drive power value and suitable for identifying a take-off power value corresponding to power used by the power take-off group. The operating unit checks the drive power value with respect to a drive threshold value and/or the power take-off power value with respect to a power take-off threshold value and is connected (Continued)

to the engine control unit to control supply of the engine group as a function of check results.

16 Claims, 3 Drawing Sheets

(51) Int. Cl.
| | |
|---|---|
| *B60W 10/04* | (2006.01) |
| *B60W 10/06* | (2006.01) |
| *B60W 30/188* | (2012.01) |
| *F02B 63/04* | (2006.01) |
| *F02B 63/06* | (2006.01) |
| *F02B 67/04* | (2006.01) |
| *F02D 29/04* | (2006.01) |
| *F02D 29/06* | (2006.01) |
| *F02D 41/08* | (2006.01) |
| *F02D 41/14* | (2006.01) |
| *G01L 13/00* | (2006.01) |
| *G01R 21/00* | (2006.01) |
| *B60K 17/28* | (2006.01) |

(52) U.S. Cl.
CPC ....... *B60W 30/1888* (2013.01); *F02B 63/042* (2013.01); *F02B 63/06* (2013.01); *F02B 67/04* (2013.01); *F02D 29/04* (2013.01); *F02D 29/06* (2013.01); *F02D 41/083* (2013.01); *F02D 41/1402* (2013.01); *G01L 13/00* (2013.01); *G01R 21/00* (2013.01); *B60K 17/28* (2013.01); *B60K 2025/022* (2013.01); *F02D 2200/10* (2013.01); *F02D 2200/1006* (2013.01); *F02D 2200/50* (2013.01)

(56) References Cited

U.S. PATENT DOCUMENTS

| | | | | |
|---|---|---|---|---|
| 9,046,160 | B2 * | 6/2015 | Hoff | F16H 48/22 |
| 10,570,849 | B2 * | 2/2020 | Homant | F02D 41/1497 |
| 11,364,914 | B2 * | 6/2022 | Jensen | B60W 30/188 |
| 2007/0032342 | A1 * | 2/2007 | Meyer | B60W 10/30 477/115 |
| 2008/0194383 | A1 * | 8/2008 | Berglund | B60W 30/19 477/97 |
| 2009/0143952 | A1 * | 6/2009 | Chisholm | B60W 10/30 701/99 |
| 2015/0120148 | A1 * | 4/2015 | Henson | B60W 30/1886 701/48 |
| 2018/0179981 | A1 * | 6/2018 | Homant | F02D 41/16 |
| 2021/0372089 | A1 * | 12/2021 | Yamada | E02F 9/2004 |
| 2022/0024455 | A1 * | 1/2022 | Jensen | F16H 61/472 |

FOREIGN PATENT DOCUMENTS

| | | | | | |
|---|---|---|---|---|---|
| CN | 113874638 | A | * | 12/2021 | ............ B60W 10/06 |
| CN | 113236763 | B | * | 10/2022 | ............ B60K 25/06 |
| CN | 113056592 | B | * | 2/2023 | ............ E02F 9/2004 |
| DE | 102021115735 | A1 | * | 1/2022 | ............ B60K 25/02 |
| EP | 3859089 | A1 | * | 8/2021 | ............ E02F 9/2004 |
| JP | 2014088106 | A | * | 5/2014 | ................ B60L 1/16 |
| JP | 5582183 | B2 | * | 9/2014 | ................ B60L 1/16 |
| JP | 7347925 | B2 | * | 9/2023 | ............ E02F 9/2004 |
| JP | 7426524 | B2 | * | 2/2024 | ............ E02F 9/2004 |
| KR | 20100060879 | A | | 6/2010 | |
| RU | 2412838 | C2 | * | 2/2011 | ............ B60W 10/06 |
| WO | 2007030069 | A1 | | 3/2007 | |
| WO | WO-2020105461 | A1 | * | 5/2020 | ............ E02F 9/2004 |
| WO | WO-2022208196 | A1 | * | 10/2022 | ............ B60K 25/02 |

* cited by examiner

VEHICLE FOR AGRICULTURAL USE COMPRISING A DETECTION SYSTEM

CROSS-REFERENCE TO RELATED APPLICATIONS

This application is a National Phase Application of PCT International Application No. PCT/IB2022/052079, having an International Filing Date of Mar. 9, 2022 which claims priority to Italian Application No. 102021000008249, filed Apr. 1, 2021, each of which is hereby incorporated by reference in its entirety.

FIELD OF THE INVENTION

The object of the present invention is a vehicle for agricultural use, preferably in the embodiment wherein the vehicle for agricultural use is a "tractor" or a "utility tractor." Further, the object of the present invention is to provide a method for managing the supply of engine power to a vehicle for agricultural use.

In the following description, the term "vehicle for agricultural use" refers both to agricultural tractors and, more generally, to earthmoving machines derived from agricultural tractors. "Tractor" refers to large-sized vehicles generally specifically for the execution of power actions, and "utility tractors" refers to smaller-sized vehicles, typically suitable for operating between rows of vines or fruit trees.

The term "wheel group" refers to all types of wheels, without any limitation to the type of tire and rim, whether single or twin.

The phrase "engine group" refers to one or more components adapted to supply engine power. "Engine group" is not limited to a particular type of power supply, whether internal combustion or electrically driven. In any case, as is more evident in the following description, the engine group of the vehicle for agricultural use of the present invention is preferably of the internal combustion type.

BACKGROUND OF THE INVENTION

In the known solutions for vehicles for agricultural use, the engine power is used to move the vehicle by transmitting said power to the wheel groups. In particular, said transmission of power to the wheel groups is controlled by a "gearbox group" positioned along the kinematic chain that joins the "engine group" and the "wheel groups."

Moreover, in known solutions for vehicles for agricultural use, the engine power also powers a "power take-off group" in order to control the movement of any accessories connected thereto.

Ultimately, in known solutions for vehicles for agricultural use, engine power is also harnessed to drive and power "auxiliary operating groups." "Auxiliary operating groups" means all those components or groups of components suitable for performing specific operations, for example comprising a fan group, an alternator group, a compressor group, a pump group, and the like. In other words, "auxiliary operating groups" also participate in engine power consumption.

A typical problem found in known vehicles for agricultural use is that of often using the engine group in a non-optimal mode in order to avoid problems or breakages in the gearbox groups or power take-off groups. For example, in some cases, it has been found that the engine group is used in a throttled mode, also known as "derated."

SUMMARY OF THE INVENTION

It is the object of the present invention to provide a vehicle for agricultural use and a method for managing the supply of engine power of a vehicle for agricultural use in which said problems are overcome, and, depending on the circumstances, the performance of the power unit is enhanced.

This is achieved by a vehicle and an engine power supply management method as described and claimed herein. Preferred embodiments are also described.

BRIEF DESCRIPTION OF THE DRAWINGS

The features and advantages of the vehicle for agricultural use according to the present invention will appear more clearly from the following description, made by way of non-limiting example according to the appended figures, wherein.

DETAILED DESCRIPTION

Figure 1:
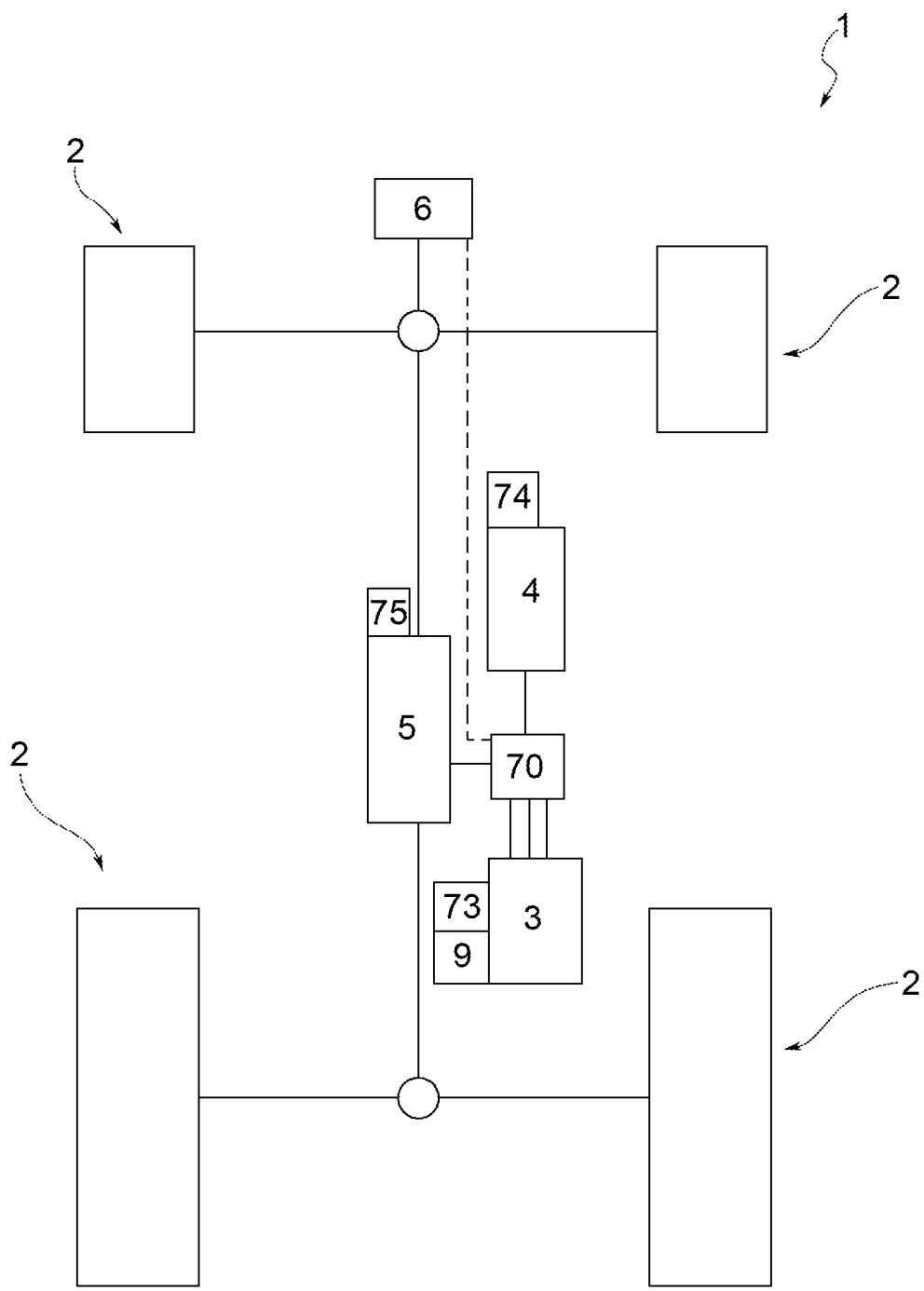
FIG. 1 illustrates a schematic of a vehicle for agricultural use according to the present invention.
Figure 2:
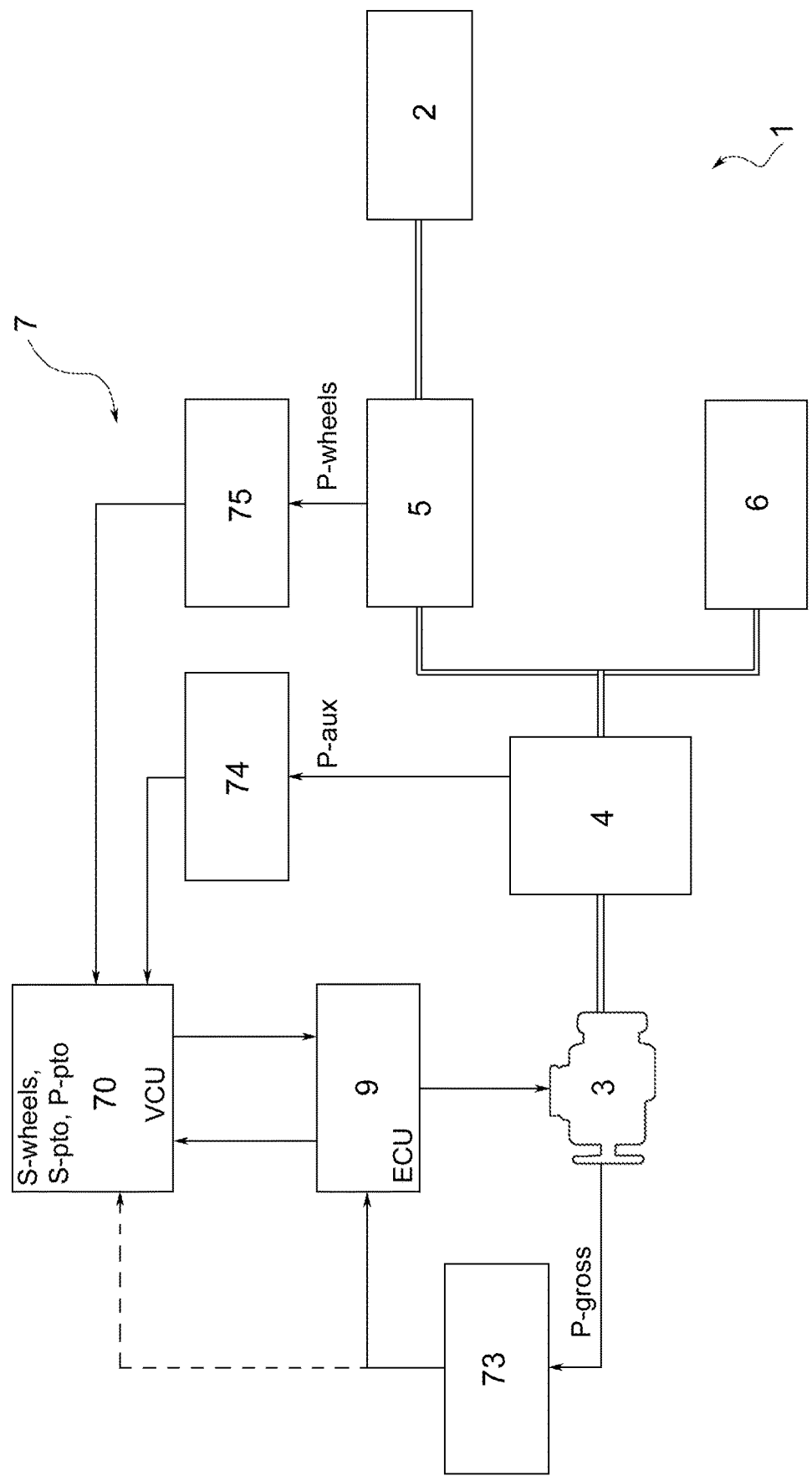
FIG. 2 shows another schematic of a vehicle for agricultural use according to the present invention.
Figure 3:
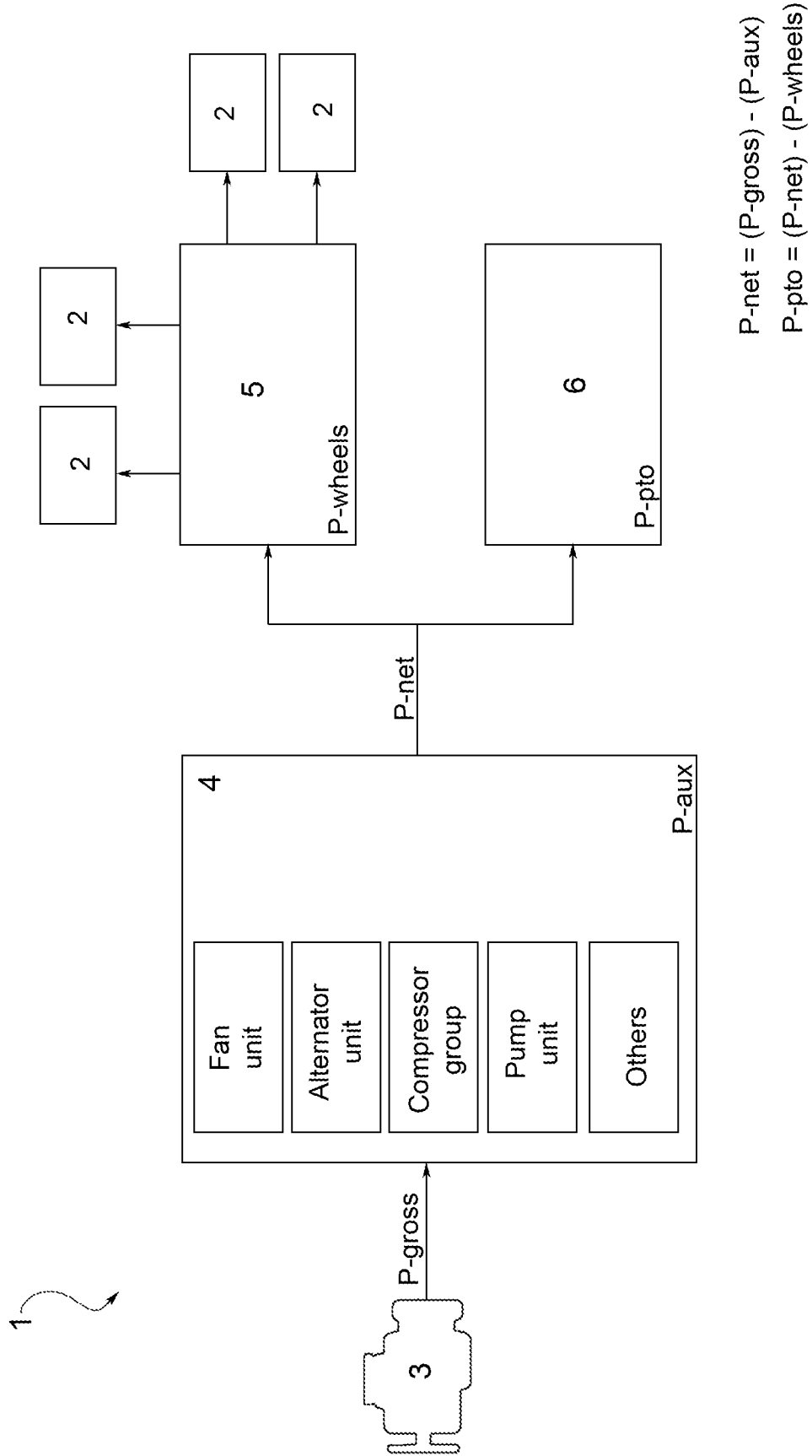
FIG. 3 shows yet another schematic of a vehicle for agricultural use according to the present invention.

According to the appended figures, 1 has been used to indicate collectively a vehicle for agricultural use.

According to the present invention, the vehicle for agricultural use 1 is a tractor.

According to the present invention, the vehicle for agricultural use 1 is a utility tractor.

According to the present invention, the vehicle for agricultural use 1 comprises wheel groups 2.

The number and type of said wheel groups 2 does not limit the present invention. Similarly, the type of axles or wheel group support 2 does not limit the present invention. Again, similarly, the type of traction, whether front, rear, or all-wheel drive, does not limit the present invention.

According to the present invention, the vehicle for agricultural use 1 comprises an engine group 3 that supplies an engine power P-gross.

Preferably, the engine group 3 is of the internal combustion type. The engine power P-gross is thus produced by the combustion and subsequent explosion of the fuel, preferably diesel-type fuel.

According to the present invention, the vehicle for agricultural use 1 comprises an engine control unit 9 operatively connected to the engine group 3 suitable for managing its supply.

Preferably, the engine control unit 9 is known as an ECU.

In other words, the engine control unit 9 suitable for modulating the behavior of the engine group 3 according to the needs and boundary conditions under which the vehicle operates.

In addition, the engine control unit 9 also receives a variety of information described at length below as part of the present invention.

The vehicle for agricultural use 1 further comprises auxiliary operating groups 4 suitable for performing specific operations, for example comprising a fan group, an alternator group, a compressor group, a pump group, and the like.

In other words, in the present discussion "auxiliary operating groups" 4 comprise all those components that, as part of the kinematic motion chain or in general as part of the normal and specific needs of the vehicle, require power to operate. Preferably, the auxiliary operating groups are powered directly on the kinematic chain, or are powered indirectly, for example, by comprising an alternator connected to the kinematic chain.

By way of example, said auxiliary groups 4 comprise the fan group suitable for performing cooling operations for the engine group.

By way of example, said auxiliary groups 4 comprise one or more pump groups suitable for performing circulating operations of certain liquids or fluids.

By way of example, said auxiliary groups 4 comprise one or more alternator groups for converting electrical energy.

By way of example, said auxiliary groups 4 comprise one or more compressor groups suitable for performing air or liquid or fluid compression operations, specific, for example, to the vehicle or passenger compartment cooling system.

By way of example, said auxiliary groups 4 comprise the windshield wiper group that comprises an alternator that powers it electrically.

As mentioned above, the vehicle for agricultural use 1 further comprises a gearbox group 5 operatively connected to the engine group 3 and the wheel groups 2 to transmit traction to the wheel groups 2. The various embodiments of the gearbox group 5 preferably comprised in the present invention will be described at length below.

In addition, the vehicle for agricultural use 1 comprises a power take-off group 6 operatively connected to the engine group 3.

Preferably, the power take-off group 6 is of the rotating mechanical type, but the present invention is not limited to any particular embodiment.

According to the present invention, moreover, the vehicle for agricultural use 1 comprises a detection system 7.

Preferably, the detection system 7 is suitable for detecting directly or indirectly certain values related to the power supplied by the engine group 3 and transmitted or consumed by the aforementioned components and groups.

In fact, the detection system 7 comprises an engine power detector 73 suitable for detecting the engine power value P-gross.

The engine power detector 73 is suitable for operating and carrying out detections in real time. The following is an extensive description of what is meant by "real time."

According to a preferred embodiment, the engine power detector 73 is of the electric type. For example, in a preferred embodiment, the engine power detector 73 comprises detectors suitable for determining the status of the engine group injectors and/or the engine revolutions.

The detection system 7 comprises an auxiliary power detector 74 suitable for detecting the auxiliary power value P-aux absorbed by the auxiliary operating groups 4.

The auxiliary power detector 74 suitable for operating and carrying out detections in real time. The following is an extensive description of what is meant by "real time."

According to a preferred embodiment, the auxiliary power detector 74 is of the electrical type. Preferably, each auxiliary operating group 4 is connected to a respective auxiliary power detector element.

The detection system 7 comprises a drive power detector 75 suitable for detecting the drive power value P-wheels.

The drive power detector 75 is suitable for operating and carrying out detections in real time. The following is an extensive description of what is meant by "real time."

According to a preferred embodiment, the gearbox group 5 is of the type comprising at least one hydrostatic unit.

According to said embodiment, the drive power detector 75 is suitable for detecting the drive power value P-wheels in real time from the detection of the pressure acting in the hydrostatic unit.

According to a preferred embodiment, the drive power detector 75 detects, in real time, the drive power value P-wheels from the detection of the input pressure and the output pressure and detects the detected pressure difference.

According to a further embodiment, the gearbox group 5 is of the electrically driven type.

Preferably, the drive power detector 75 detects, in real time, the drive power value P-wheels from the detection of the current absorbed by the electric drive.

According to the present invention, the detection system 7 comprises an operating unit 70 operatively connected to the above-mentioned detectors.

According to a preferred embodiment, the operating unit 70 is also operatively connected to a plurality of devices suitable for detecting or estimating certain conditions of the vehicle, for example, speed, steering angle, type of operation/work performed, also as a function of the nature of the terrain.

Preferably, said operating unit 70 is also known as a vehicle control unit, also referred to as a VCU.

According to the present invention, the operating unit 70 is operatively connected to the engine power detector 73, the auxiliary power detector 74, and the drive power detector 75.

According to a preferred embodiment, the engine control unit 9, the operating unit 70, the engine power detector 73, the auxiliary power detector 74, and the drive power detector 75 are distinct components.

According to other preferred embodiments, the engine control unit 9, the operating unit 70, the engine power detector 73, the auxiliary power detector 74, and the drive power detector 75 are merged. For example, in a preferred embodiment, the engine power detector 73 and the engine control unit 9 are in the same component. For example, in a preferred embodiment, the auxiliary power detector 74 and the operating unit 70 are in the same component.

The operating unit 70 then receives the engine power value P-gross, the auxiliary power value P-aux, and the drive power value P-wheels.

The operating unit 70 further identifies in real time a power take-off power value P-pto corresponding to the power used by the power take-off 6.

According to a preferred embodiment, the operating unit 70 identifies the power take-off power value P-pto by subtracting the auxiliary power value P-aux and the drive power value P-wheels from the engine power value P-gross. Preferably, the operating unit 70 identifies a net power value P-net by subtracting the auxiliary power value P-aux from the engine power value P-gross.

Further, according to the present invention, the operating unit 70 is suitable for checking the drive power value P-wheels with respect to a drive threshold value S-wheels and/or the power take-off power value P-pto with respect to a power take-off threshold value S-pto.

According to the invention, therefore, the operating unit 70 is connected to the engine control unit 9 in such a way that it controls the supply of the engine group 3 as a function of the result of the aforesaid check.

In other words, as a function of all the data received and identified, after the above checks have been performed, the operating unit 70 is suitable for giving certain commands to the engine control unit 9 with the aim of increasing the engine power supply P-gross.

In other words, depending on all the data received and identified, after the aforesaid checks have been carried out, the operating unit 70 is suitable for giving certain commands to the engine control unit 9 with the aim of decreasing the engine power supply P-gross.

According to a preferred embodiment, the engine control unit 9 commands a lowering of the supply of the engine group 3 when the drive threshold value S-wheels and/or the power take-off threshold value S-pto are exceeded.

According to a preferred embodiment, this mode of use is preferably providable on tractors.

According to the aforesaid preferred embodiment, the drive threshold value S-wheels and/or the power take-off threshold value S-pto are upper limit values, above which the probability of breakage or excessive wear is high.

According to a further preferred embodiment, the engine control unit 9 commands an increase in the supply of the engine group 3 as a function of the check performed with respect to the drive threshold value S-wheels and/or the power take-off threshold value S-pto.

According to a preferred embodiment, this mode of use is preferably providable on utility tractors.

According to said preferred embodiment, the drive threshold value S-wheels and/or the power take-off threshold value S-pto are predefined limit values. In particular, a predefined limit value is defined as a value which may be identified as a function of certain features of the vehicle for agricultural use and/or of certain features of the environment in which it is in operation or in motion and/or of determining features that are a function of the operations that the vehicle for agricultural use carries out.

Preferably, said embodiment also provides for drive threshold values and/or maximum limit power take-off threshold values, i.e., values that must not be exceeded, in a way similar to the embodiment described above.

According to a preferred embodiment, the aforesaid threshold values are preset and stored in the operating unit 70.

According to a preferred embodiment, the drive threshold value S-wheels is identified by the operating unit 70 with respect to a respective drive threshold map that is a function of the operating conditions of the vehicle.

According to a preferred embodiment, the power take-off threshold value S-pto is identified by the operating unit 70 with respect to a respective power take-off threshold map that is a function of the operating conditions of the vehicle.

According to this embodiment, "real time" means detection, identification, and verification that is substantially constant over time. In particular, "real time" means that detection, identification, and verification are performed in a "closed loop" mode by giving commands to the engine group constantly over time as a result of continuous detection, identification, and verification of information obtained from the detection system 7.

Preferably, detections, identifications, and verifications are performed with a frequency of 50 Hz-20 ms.

The object of the present invention is also to provide a method for managing the engine power supply P-gross of a vehicle for agricultural use 1, wherein the vehicle for agricultural use 1 comprises the essential features described above.

Thus, the management method comprises the steps of:
detecting an engine power value P-gross, an auxiliary power value P-aux, and a drive power value P-wheels, by means of an engine power detector 73, an auxiliary power detector 74, and a drive power detector 75;
identifying a power take-off power value P-pto;
checking the drive power value P-wheels with respect to a drive threshold value S-wheels and/or the power take-off power value P-pto with respect to a power take-off threshold value S-pto;
commanding the supply of the engine group 3 according to the result of the aforesaid check.

According to a preferred embodiment, wherein the vehicle for agricultural use 1 is a tractor, the management method of the engine power supply P-gross comprises the steps of:
commanding a lowering of the supply of the engine group 3 when the drive threshold value S-wheels and/or the power take-off threshold value S-pto are exceeded, wherein the drive threshold value S-wheels and/or the power take-off threshold value S-pto are upper limit values.

According to a preferred embodiment, wherein the vehicle for agricultural use 1 is an utility tractor, the management method of the engine power supply P-gross comprises the steps of:
commanding an increase in the supply of the engine group 3 based on the verification of the drive threshold value S-wheels and/or the power take-off threshold value S-pto, wherein the drive threshold value S-wheels and/or the power take-off threshold value S-pto are predefined limit values.

Innovatively, the vehicle for agricultural use and the method for managing the power supply of a vehicle for agricultural use of the present invention enable the object set forth in the invention, namely, to improve the utilization of the engine group to its maximum efficiency, to be achieved.

Advantageously, the vehicle for agricultural use avoids operating conditions wherein the engine group operates at an inappropriate power level, e.g., too low or too high.

Advantageously, the vehicle for agricultural use avoids the possibility that too much engine power reaches the gearbox group and/or the power take-off group, causing damage thereto.

It is clear that a person skilled in the art, in order to meet contingent needs, could make modifications to the vehicle or supply method, all of which are contained within the scope of protection defined by the following claims.

What is claimed is:

1. A vehicle for agricultural use, comprising:
i) wheel groups;
ii) an engine group that supplies an engine power;
iii) an engine control unit operatively connected to the engine group, the engine control unit configured to manage a supply of the engine group;
iv) auxiliary operating groups configured to perform specific operations;
v) a gearbox group operatively connected to the engine group and to the wheel groups to transmit traction to the wheel groups;
vi) a power take-off group operatively connected to the engine group; and
vii) a detection system comprising:
an engine power detector configured to detect an engine power value in real time;
an auxiliary power detector configured to detect, in real time, an auxiliary power value absorbed by the auxiliary operating groups;
a drive power detector configured to detect a drive power value in real time, wherein the engine power value, the auxiliary power value, and the drive power value are detected independently of one another; and an operating unit operatively connected to the engine power detector, the auxiliary power detector, and the drive power detector, the operating unit configured to receive the engine power value, the auxiliary power value, and the drive power value, and to identify, in real time, a power take-off power value corresponding to power used by the power take-off group by subtracting the auxiliary power value and the drive power value from the engine power value;

wherein the operating unit is further configured to check the drive power value with respect to a drive threshold value and/or the power take-off power value with respect to a power take-off threshold value; and wherein the operating unit is connected to the engine control unit and further configured to control the supply of the engine group as a function of the results of the check.

2. The vehicle for agricultural use of claim 1, wherein the engine control unit controls a decrease in the supply of the engine group when the drive threshold value and/or the power take-off threshold value is exceeded, and wherein the drive threshold value and/or the power take-off threshold value are maximum limit values.

3. The vehicle for agricultural use of claim 2, wherein said vehicle for agricultural use is a tractor.

4. The vehicle for agricultural use of claim 1, wherein the engine control unit controls an increase in the supply of the engine group as a function of the check of the drive threshold value and/or the power take-off threshold value, and wherein the drive threshold value and/or the power take-off threshold value are predefined limit values.

5. The vehicle for agricultural use of claim 4, wherein said vehicle for agricultural use is a utility tractor.

6. The vehicle for agricultural use of claim 1, wherein said drive threshold value is identified by the operating unit with respect to a respective drive threshold map, and said power take-off threshold value is identified by the operating unit with respect to a respective power take-off threshold map as a function of operating conditions of the vehicle.

7. The vehicle for agricultural use of claim 1, wherein the gearbox group comprises at least one hydrostatic unit.

8. The vehicle for agricultural use of claim 7, wherein the drive power detector is configured to detect, in real time, the drive power value from detection of a pressure acting in the at least one hydrostatic unit.

9. The vehicle for agricultural use of claim 8, wherein the drive power detector detects, in real time, the drive power value from detection of an inlet pressure and/or an outlet pressure and from evaluation of a detected pressure difference.

10. The vehicle for agricultural use of claim 1, wherein the gearbox group is of the electrically operated type.

11. The vehicle for agricultural use of claim 1, wherein the engine group is of the internal combustion type.

12. The vehicle for agricultural use of claim 1, wherein detections and checks are in real time, being performed in a closed-loop mode.

13. A method of managing supply of engine power of a vehicle for agricultural use comprising:
  i) wheel groups;
  ii) an engine group that supplies an engine power;
  iii) an engine control unit operatively connected to the engine group, configured to manage a supply of the engine group;
  iv) auxiliary operating groups configured to perform specific operations;
  v) a gearbox group operatively connected to the engine group and to the wheel groups to transmit traction to the wheel groups;
  vi) a power take-off group operatively connected to the engine group; and
  vii) a detection system comprising:
  an engine power detector configured to detect an engine power value in real time;
  an auxiliary power detector configured to detect, in real time, an auxiliary power value absorbed by the auxiliary operating groups;
  a drive power detector configured to detect a drive power value in real time; and
  an operating unit operatively connected to the engine power detector, the auxiliary power detector, and the drive power detector, the operating unit configured to receive the engine power value, the auxiliary power value, and the drive power value, and to identify, in real time, a power take-off power value corresponding to power used by the power take-off group;
  wherein the operating unit is further configured to check the drive power value with respect to a drive threshold value and/or the power take-off power value with respect to a power take-off threshold value; and
  wherein the operating unit is connected to the engine control unit to control the supply of the engine group as a function of the results of the check, the method comprising:
  independently detecting, by the engine power detector, the auxiliary power detector and the drive power detector, the engine power value, the auxiliary power value, and the drive power value, respectively;
  identifying the power take-off power value by subtracting the auxiliary power value and the drive power value from the engine power value;
  checking the drive power value with respect to the drive threshold value and/or the power take-off power value with respect to the power take-off threshold value; and
  commanding the supply of the engine group as a function of the results of the check.

14. The method of claim 13, further comprising:
  commanding a decrease in the supply of the engine group when the drive threshold value and/or the power take-off threshold value are exceeded, wherein the drive threshold value and/or the power take-off threshold value are maximum limit values.

15. The method of claim 13, further comprising:
  commanding an increase in the supply of the engine group as a function of the check of the drive threshold value and/or the power take-off threshold value, wherein the drive threshold value and/or the power take-off threshold value are predefined limit values.

16. The vehicle for agricultural use of claim 1, wherein the auxiliary operating groups comprise a fan unit, an alternator unit, a compressor group, and a pump unit.

* * * * *